US012755143B2

(12) United States Patent
Cummins et al.

(10) Patent No.: US 12,755,143 B2
(45) Date of Patent: Oct. 6, 2026

(54) IMPLEMENT THE COMPUTATION OF AN ARTIFICIAL NEURAL NETWORK USING MULTIPLE DEEP LEARNING ACCELERATORS

(71) Applicant: Micron Technology, Inc., Boise, ID (US)

(72) Inventors: Jaime Cummins, Bainbridge Island, WA (US); Marko Vitez, Trieste (IT); Eugenio Culurciello, West Lafayette, IN (US); Andre Xian Ming Chang, Seattle, WA (US); Aliasger Tayeb Zaidy, Seattle, WA (US)

(73) Assignee: Micron Technology, Inc., Boise, ID (US)

(*) Notice: Subject to any disclaimer, the term of this patent is extended or adjusted under 35 U.S.C. 154(b) by 1092 days.

(21) Appl. No.: 17/092,038

(22) Filed: Nov. 6, 2020

(65) Prior Publication Data

US 2022/0147811 A1 May 12, 2022

(51) Int. Cl.
*G06N 3/08* (2023.01)
*G06F 8/41* (2018.01)
*G06N 3/04* (2023.01)
*G11C 11/54* (2006.01)

(52) U.S. Cl.
CPC ................. *G06N 3/08* (2013.01); *G06F 8/41* (2013.01); *G06N 3/04* (2013.01); *G11C 11/54* (2013.01)

(58) Field of Classification Search
CPC ............... G06N 3/08; G06N 3/04; G06F 8/41
See application file for complete search history.

(56) References Cited

U.S. PATENT DOCUMENTS

| | | | | |
|---|---|---|---|---|
| 10,685,295 | B1 | 6/2020 | Ross et al. | |
| 2018/0046897 | A1 | 2/2018 | Kang et al. | |
| 2018/0336453 | A1 | 11/2018 | Merity et al. | |
| 2019/0180170 | A1* | 6/2019 | Huang ................... | G06N 3/044 |
| 2019/0286972 | A1 | 9/2019 | El Husseini et al. | |
| 2020/0026992 | A1* | 1/2020 | Zhang .................... | G06N 3/084 |
| 2020/0210821 | A1 | 7/2020 | Guo et al. | |

OTHER PUBLICATIONS

Ma, Yufei, et al. “Optimizing the convolution operation to accelerate deep neural networks on FPGA.” IEEE Transactions on Very Large Scale Integration (VLSI) Systems 26.7 (2018): 1354-1367. (Year: 2018).*
International Search Report and Written Opinion, PCT/US2021/055401, mailed on Feb. 3, 2022.

* cited by examiner

*Primary Examiner* — Kamran Afshar
*Assistant Examiner* — Lokesha Patel
(74) *Attorney, Agent, or Firm* — Greenberg Traurig

(57) ABSTRACT

Systems, devices, and methods related to a Deep Learning Accelerator and memory are described. For example, an integrated circuit device may be configured to execute instructions with matrix operands and configured with random access memory (RAM). A compiler can identify a plurality of portions of an artificial neural network for implementation on a plurality of such integrated circuit devices respectively. The compiler converts a description of the artificial neural network into a plurality of compiler outputs executable on the plurality of devices to generate an output of the artificial neural network response to an input to the artificial neural network. Intermediate results are communicated among the devices in generating the output of the artificial neural network.

20 Claims, 11 Drawing Sheets

IMPLEMENT THE COMPUTATION OF AN ARTIFICIAL NEURAL NETWORK USING MULTIPLE DEEP LEARNING ACCELERATORS

TECHNICAL FIELD

At least some embodiments disclosed herein relate to compilers in general and more particularly, but not limited to, compilers to generate instructions executable by multiple accelerators to implement an Artificial Neural Network (ANN), such as an ANN configured through machine learning and/or deep learning.

BACKGROUND

An Artificial Neural Network (ANN) uses a network of neurons to process inputs to the network and to generate outputs from the network.

Deep learning has been applied to many application fields, such as computer vision, speech/audio recognition, natural language processing, machine translation, bioinformatics, drug design, medical image processing, games, etc.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
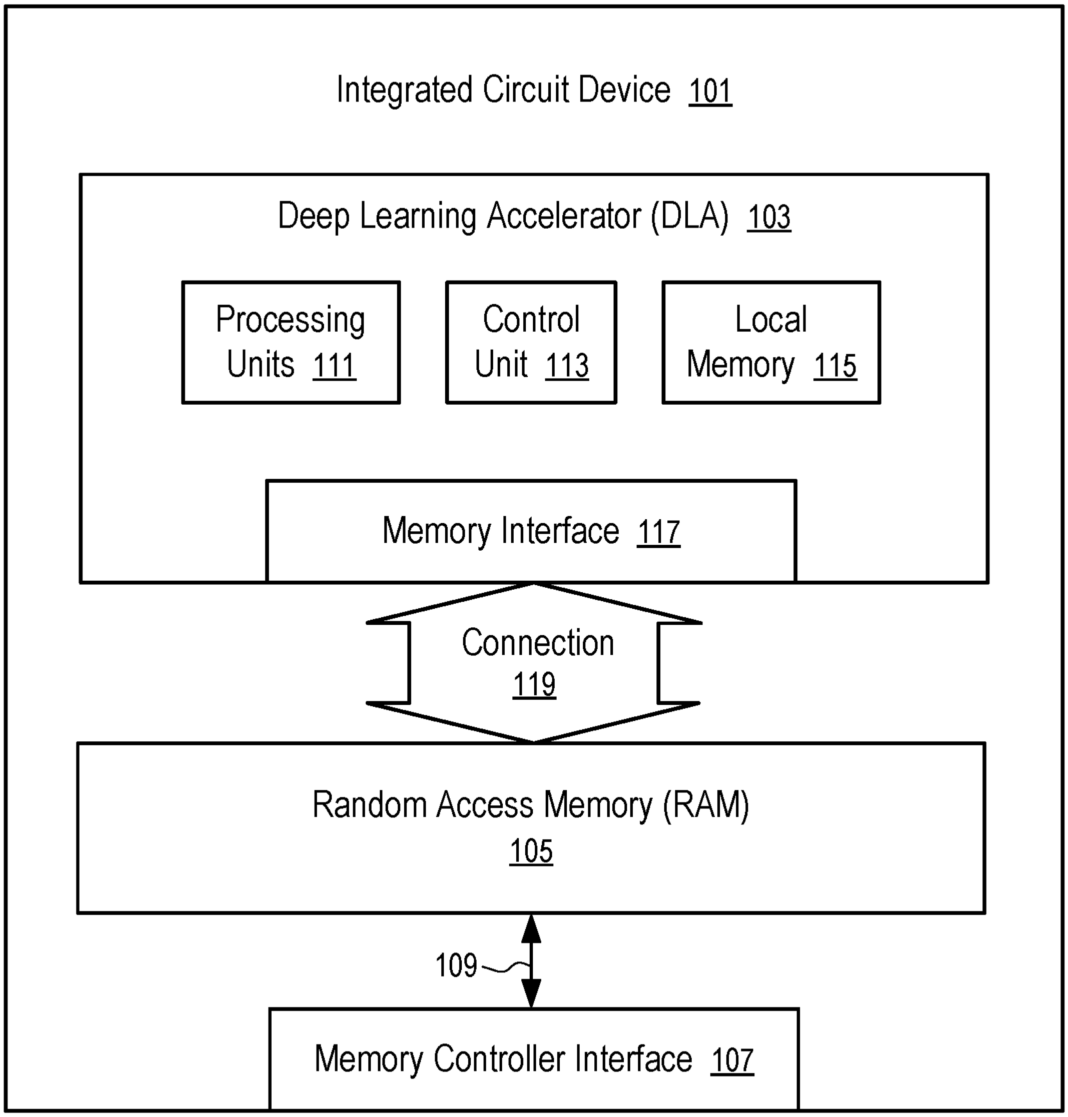
FIG. 1 shows an integrated circuit device having a Deep Learning Accelerator and random access memory configured according to one embodiment.

At least some embodiments disclosed herein provide a compiler for integrated circuits configured to implement the computation of Artificial Neural Networks (ANNs) with reduced energy consumption and computation time. Such an integrated circuit device can include a Deep Learning Accelerator (DLA) and random access memory. The random access memory is configured to store parameters of an Artificial Neural Network (ANN) and instructions having matrix operands. The instructions stored in the random access memory are executable by the Deep Learning Accelerator (DLA) to implement matrix computations according to the Artificial Neural Network (ANN). The compiler can generate instructions to implement an Artificial Neural Network using multiple Deep Learning Accelerators.

For example, the compiler can identify multiple portions of an Artificial Neural Network (ANN) for implementation on multiple Deep Learning Accelerators respectively. The multiple Deep Learning Accelerators can have different hardware and thus may not be homogeneous. The Deep Learning Accelerators can cooperate with each other, as directed by the compiler, to implement the Artificial Neural Network (ANN).

For example, Deep Learning Accelerators that are different in architecture and computing capabilities can be interconnected to form a system. Optionally, different types of connections among the Deep Learning Accelerators can be used in different systems. Optionally, the compiler can automatically detect or discover the features and capabilities of multiple sets of hardware of the Deep Learning Accelerators and/or the characteristics of the communication bandwidth among them. The compiler divides the computations of the Artificial Neural Network (ANN) into tasks distributed to the multiple sets of hardware in a way that optimizes the overall performance of the system.

For example, each neuron in the network receives a set of inputs. Some of the inputs to a neuron may be the outputs of certain neurons in the network; and some of the inputs to a neuron may be the inputs provided to the neural network. The input/output relations among the neurons in the network represent the neuron connectivity in the network.

For example, each neuron can have a bias, an activation function, and a set of synaptic weights for its inputs respectively. The activation function may be in the form of a step function, a linear function, a log-sigmoid function, etc. Different neurons in the network may have different activation functions.

For example, each neuron can generate a weighted sum of its inputs and its bias and then produce an output that is the function of the weighted sum, computed using the activation function of the neuron.

The relations between the input(s) and the output(s) of an ANN in general are defined by an ANN model that includes the data representing the connectivity of the neurons in the network, as well as the bias, activation function, and synaptic weights of each neuron. Based on a given ANN model, a computing device can be configured to compute the output(s) of the network from a given set of inputs to the network.

For example, the inputs to an ANN network may be generated based on camera inputs; and the outputs from the ANN network may be the identification of an item, such as an event or an object.

In general, an ANN may be trained using a supervised method where the parameters in the ANN are adjusted to minimize or reduce the error between known outputs associated with or resulted from respective inputs and computed outputs generated via applying the inputs to the ANN. Examples of supervised learning/training methods include reinforcement learning and learning with error correction.

Alternatively, or in combination, an ANN may be trained using an unsupervised method where the exact outputs resulted from a given set of inputs is not known before the completion of the training. The ANN can be trained to classify an item into a plurality of categories, or data points into clusters.

Multiple training algorithms can be employed for a sophisticated machine learning/training paradigm.

Deep learning uses multiple layers of machine learning to progressively extract features from input data. For example, lower layers can be configured to identify edges in an image; and higher layers can be configured to identify, based on the edges detected using the lower layers, items captured in the image, such as faces, objects, events, etc. Deep learning can be implemented via Artificial Neural Networks (ANNs), such as deep neural networks, deep belief networks, recurrent neural networks, and/or convolutional neural networks.

A typical Deep Learning Accelerator (DLA) can include a set of programmable hardware computing logic that is specialized and/or optimized to perform parallel vector and/or matrix calculations, including but not limited to multiplication and accumulation of vectors and/or matrices.

Further, the Deep Learning Accelerator can include one or more Arithmetic-Logic Units (ALUs) to perform arithmetic and bitwise operations on integer binary numbers.

The Deep Learning Accelerator is programmable via a set of instructions to perform the computations of an Artificial Neural Network (ANN).

The granularity of the Deep Learning Accelerator operating on vectors and matrices corresponds to the largest unit of vectors/matrices that can be operated upon during the execution of one instruction by the Deep Learning Accelerator. During the execution of the instruction for a predefined operation on vector/matrix operands, elements of vector/matrix operands can be operated upon by the Deep Learning Accelerator in parallel to reduce execution time and/or energy consumption associated with memory/data access. The operations on vector/matrix operands of the granularity of the Deep Learning Accelerator can be used as building blocks to implement computations on vectors/matrices of larger sizes.

The implementation of a typical/practical Artificial Neural Network involves vector/matrix operands having sizes that are larger than the operation granularity of the Deep Learning Accelerator. To implement such an Artificial Neural Network using the Deep Learning Accelerator, computations involving the vector/matrix operands of large sizes can be broken down to the computations of vector/matrix operands of the granularity of the Deep Learning Accelerator. The Deep Learning Accelerator can be programmed via instructions to carry out the computations involving large vector/matrix operands. For example, atomic computation capabilities of the Deep Learning Accelerator in manipulating vectors and matrices of the granularity of the Deep Learning Accelerator in response to instructions can be programmed to implement computations in an Artificial Neural Network.

In some implementations, the Deep Learning Accelerator lacks some of the logic operation capabilities of a typical Central Processing Unit (CPU). However, the Deep Learning Accelerator can be configured with sufficient logic units to process the input data provided to an Artificial Neural Network and generate the output of the Artificial Neural Network according to a set of instructions generated for the Deep Learning Accelerator. Thus, the Deep Learning Accelerator can perform the computation of an Artificial Neural Network with little or no help from a Central Processing Unit (CPU) or another processor. Optionally, a conventional general purpose processor can also be configured as part of the Deep Learning Accelerator to perform operations that cannot be implemented efficiently using the vector/matrix processing units of the Deep Learning Accelerator, and/or that cannot be performed by the vector/matrix processing units of the Deep Learning Accelerator.

A typical Artificial Neural Network can be described/specified in a standard format (e.g., Open Neural Network Exchange (ONNX)). A compiler can be used to convert the description of the Artificial Neural Network into a set of instructions for the Deep Learning Accelerator to perform calculations of the Artificial Neural Network. The compiler can optimize the set of instructions to improve the performance of the Deep Learning Accelerator in implementing the Artificial Neural Network.

The Deep Learning Accelerator can have local memory, such as registers, buffers and/or caches, configured to store vector/matrix operands and the results of vector/matrix operations. Intermediate results in the registers can be pipelined/shifted in the Deep Learning Accelerator as operands for subsequent vector/matrix operations to reduce time and energy consumption in accessing memory/data and thus speed up typical patterns of vector/matrix operations in implementing a typical Artificial Neural Network. The capacity of registers, buffers and/or caches in the Deep Learning Accelerator is typically insufficient to hold the entire data set for implementing the computation of a typical Artificial Neural Network. Thus, a random access memory coupled to the Deep Learning Accelerator is configured to provide an improved data storage capability for implementing a typical Artificial Neural Network. For example, the Deep Learning Accelerator loads data and instructions from the random access memory and stores results back into the random access memory.

The communication bandwidth between the Deep Learning Accelerator and the random access memory is configured to optimize or maximize the utilization of the computation power of the Deep Learning Accelerator. For example, high communication bandwidth can be provided between the Deep Learning Accelerator and the random access memory such that vector/matrix operands can be loaded from the random access memory into the Deep Learning Accelerator and results stored back into the random access memory in a time period that is approximately equal to the time for the Deep Learning Accelerator to perform the computations on the vector/matrix operands. The granularity of the Deep Learning Accelerator can be configured to increase the ratio between the amount of computations performed by the Deep Learning Accelerator and the size of the vector/matrix operands such that the data access traffic between the Deep Learning Accelerator and the random access memory can be reduced, which can reduce the requirement on the communication bandwidth between the Deep Learning Accelerator and the random access memory. Thus, the bottleneck in data/memory access can be reduced or eliminated.

FIG. 1 shows an integrated circuit device (101) having a Deep Learning Accelerator (103) and random access memory (105) configured according to one embodiment.

The Deep Learning Accelerator (103) in FIG. 1 includes processing units (111), a control unit (113), and local memory (115). When vector and matrix operands are in the local memory (115), the control unit (113) can use the processing units (111) to perform vector and matrix operations in accordance with instructions. Further, the control unit (113) can load instructions and operands from the random access memory (105) through a memory interface (117) and a high speed/bandwidth connection (119).

The integrated circuit device (101) is configured to be enclosed within an integrated circuit package with pins or contacts for a memory controller interface (107).

The memory controller interface (107) is configured to support a standard memory access protocol such that the integrated circuit device (101) appears to a typical memory controller in a way same as a conventional random access memory device having no Deep Learning Accelerator (103). For example, a memory controller external to the integrated circuit device (101) can access, using a standard memory access protocol through the memory controller interface (107), the random access memory (105) in the integrated circuit device (101).

The integrated circuit device (101) is configured with a high bandwidth connection (119) between the random access memory (105) and the Deep Learning Accelerator (103) that are enclosed within the integrated circuit device (101). The bandwidth of the connection (119) is higher than the bandwidth of the connection (109) between the random access memory (105) and the memory controller interface (107).

In one embodiment, both the memory controller interface (107) and the memory interface (117) are configured to access the random access memory (105) via a same set of buses or wires. Thus, the bandwidth to access the random access memory (105) is shared between the memory interface (117) and the memory controller interface (107). Alternatively, the memory controller interface (107) and the memory interface (117) are configured to access the random access memory (105) via separate sets of buses or wires. Optionally, the random access memory (105) can include multiple sections that can be accessed concurrently via the connection (119). For example, when the memory interface (117) is accessing a section of the random access memory (105), the memory controller interface (107) can concurrently access another section of the random access memory (105). For example, the different sections can be configured on different integrated circuit dies and/or different planes/banks of memory cells; and the different sections can be accessed in parallel to increase throughput in accessing the random access memory (105). For example, the memory controller interface (107) is configured to access one data unit of a predetermined size at a time; and the memory interface (117) is configured to access multiple data units, each of the same predetermined size, at a time.

In one embodiment, the random access memory (105) and the integrated circuit device (101) are configured on different integrated circuit dies configured within a same integrated circuit package. Further, the random access memory (105) can be configured on one or more integrated circuit dies that allows parallel access of multiple data elements concurrently.

In some implementations, the number of data elements of a vector or matrix that can be accessed in parallel over the connection (119) corresponds to the granularity of the Deep Learning Accelerator operating on vectors or matrices. For example, when the processing units (111) can operate on a number of vector/matrix elements in parallel, the connection (119) is configured to load or store the same number, or multiples of the number, of elements via the connection (119) in parallel.

Optionally, the data access speed of the connection (119) can be configured based on the processing speed of the Deep Learning Accelerator (103). For example, after an amount of data and instructions have been loaded into the local memory (115), the control unit (113) can execute an instruction to operate on the data using the processing units (111) to generate output. Within the time period of processing to generate the output, the access bandwidth of the connection (119) allows the same amount of data and instructions to be loaded into the local memory (115) for the next operation and the same amount of output to be stored back to the random access memory (105). For example, while the control unit (113) is using a portion of the local memory (115) to process data and generate output, the memory interface (117) can offload the output of a prior operation into the random access memory (105) from, and load operand data and instructions into, another portion of the local memory (115). Thus, the utilization and performance of the Deep Learning Accelerator are not restricted or reduced by the bandwidth of the connection (119).

The random access memory (105) can be used to store the model data of an Artificial Neural Network and to buffer input data for the Artificial Neural Network. The model data does not change frequently. The model data can include the output generated by a compiler for the Deep Learning Accelerator to implement the Artificial Neural Network. The model data typically includes matrices used in the description of the Artificial Neural Network and instructions generated for the Deep Learning Accelerator (103) to perform vector/matrix operations of the Artificial Neural Network based on vector/matrix operations of the granularity of the Deep Learning Accelerator (103). The instructions operate not only on the vector/matrix operations of the Artificial Neural Network, but also on the input data for the Artificial Neural Network.

In one embodiment, when the input data is loaded or updated in the random access memory (105), the control unit (113) of the Deep Learning Accelerator (103) can automatically execute the instructions for the Artificial Neural Network to generate an output of the Artificial Neural Network. The output is stored into a predefined region in the random access memory (105). The Deep Learning Accelerator (103) can execute the instructions without help from a Central Processing Unit (CPU). Thus, communications for the coordination between the Deep Learning Accelerator (103) and a processor outside of the integrated circuit device (101) (e.g., a Central Processing Unit (CPU)) can be reduced or eliminated.

Optionally, the logic circuit of the Deep Learning Accelerator (103) can be implemented via Complementary Metal Oxide Semiconductor (CMOS). For example, the technique of CMOS Under the Array (CUA) of memory cells of the random access memory (105) can be used to implement the logic circuit of the Deep Learning Accelerator (103), including the processing units q(111) and the control unit (113). Alternatively, the technique of CMOS in the Array of memory cells of the random access memory (105) can be used to implement the logic circuit of the Deep Learning Accelerator (103).

In some implementations, the Deep Learning Accelerator (103) and the random access memory (105) can be implemented on separate integrated circuit dies and connected using Through-Silicon Vias (TSV) for increased data bandwidth between the Deep Learning Accelerator (103) and the random access memory (105). For example, the Deep Learning Accelerator (103) can be formed on an integrated circuit die of a Field-Programmable Gate Array (FPGA) or Application Specific Integrated circuit (ASIC).

Alternatively, the Deep Learning Accelerator (103) and the random access memory (105) can be configured in separate integrated circuit packages and connected via multiple point-to-point connections on a printed circuit board (PCB) for parallel communications and thus increased data transfer bandwidth.

The random access memory (105) can be volatile memory or non-volatile memory, or a combination of volatile memory and non-volatile memory. Examples of non-volatile memory include flash memory, memory cells formed based on negative- and (NAND) logic gates, negative- or (NOR) logic gates, Phase-Change Memory (PCM), magnetic memory (MRAM), resistive random-access memory, cross point storage and memory devices. A cross point memory device can use transistor-less memory elements, each of which has a memory cell and a selector that are stacked together as a column. Memory element columns are connected via two lays of wires running in perpendicular directions, where wires of one lay run in one direction in the layer that is located above the memory element columns, and wires of the other lay run in another direction and are located below the memory element columns. Each memory element can be individually selected at a cross point of one wire on each of the two layers. Cross point memory devices are fast and non-volatile and can be used as a unified memory pool for processing and storage. Further examples of non-volatile memory include Read-Only Memory (ROM), Programmable Read-Only Memory (PROM), Erasable Programmable Read-Only Memory (EPROM) and Electronically Erasable Programmable Read-Only Memory (EEPROM) memory, etc. Examples of volatile memory include Dynamic Random-Access Memory (DRAM) and Static Random-Access Memory (SRAM).

For example, non-volatile memory can be configured to implement at least a portion of the random access memory (105). The non-volatile memory in the random access memory (105) can be used to store the model data of an Artificial Neural Network. Thus, after the integrated circuit device (101) is powered off and restarts, it is not necessary to reload the model data of the Artificial Neural Network into the integrated circuit device (101). Further, the non-volatile memory can be programmable/rewritable. Thus, the model data of the Artificial Neural Network in the integrated circuit device (101) can be updated or replaced to implement an update Artificial Neural Network, or another Artificial Neural Network.

The processing units (111) of the Deep Learning Accelerator (103) can include vector-vector units, matrix-vector units, and/or matrix-matrix units. Examples of units configured to perform for vector-vector operations, matrix-vector operations, and matrix-matrix operations are discussed below in connection with FIGS. 2-4.

Figure 2:
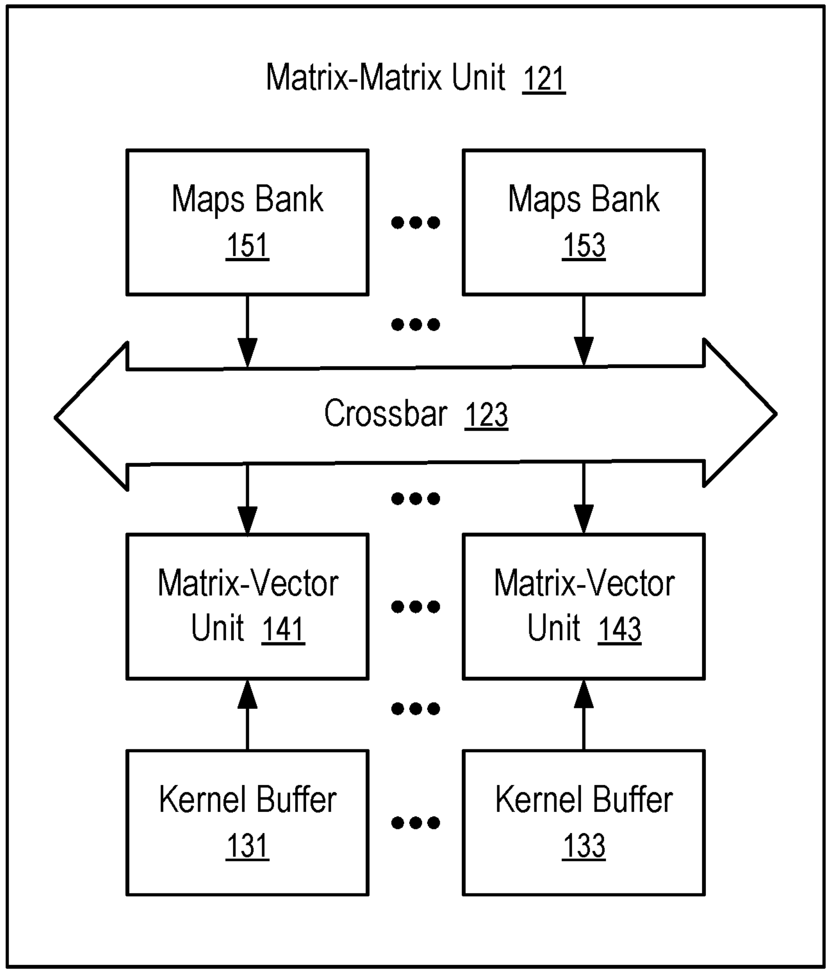
FIG. 2 shows a processing unit configured to perform matrix-matrix operations according to one embodiment.

FIG. 2 shows a processing unit configured to perform matrix-matrix operations according to one embodiment. For example, the matrix-matrix unit (121) of FIG. 2 can be used as one of the processing units (111) of the Deep Learning Accelerator (103) of FIG. 1.

In FIG. 2, the matrix-matrix unit (121) includes multiple kernel buffers (131 to 133) and multiple the maps banks (151 to 153). Each of the maps banks (151 to 153) stores one vector of a matrix operand that has multiple vectors stored in the maps banks (151 to 153) respectively; and each of the kernel buffers (131 to 133) stores one vector of another matrix operand that has multiple vectors stored in the kernel buffers (131 to 133) respectively. The matrix-matrix unit (121) is configured to perform multiplication and accumulation operations on the elements of the two matrix operands, using multiple matrix-vector units (141 to 143) that operate in parallel.

A crossbar (123) connects the maps banks (151 to 153) to the matrix-vector units (141 to 143). The same matrix operand stored in the maps bank (151 to 153) is provided via the crossbar (123) to each of the matrix-vector units (141 to 143); and the matrix-vector units (141 to 143) receives data elements from the maps banks (151 to 153) in parallel. Each of the kernel buffers (131 to 133) is connected to a respective one in the matrix-vector units (141 to 143) and provides a vector operand to the respective matrix-vector unit. The matrix-vector units (141 to 143) operate concurrently to compute the operation of the same matrix operand, stored in the maps banks (151 to 153) multiplied by the corresponding vectors stored in the kernel buffers (131 to 133). For example, the matrix-vector unit (141) performs the multiplication operation on the matrix operand stored in the maps banks (151 to 153) and the vector operand stored in the kernel buffer (131), while the matrix-vector unit (143) is concurrently performing the multiplication operation on the matrix operand stored in the maps banks (151 to 153) and the vector operand stored in the kernel buffer (133).

Figure 3:
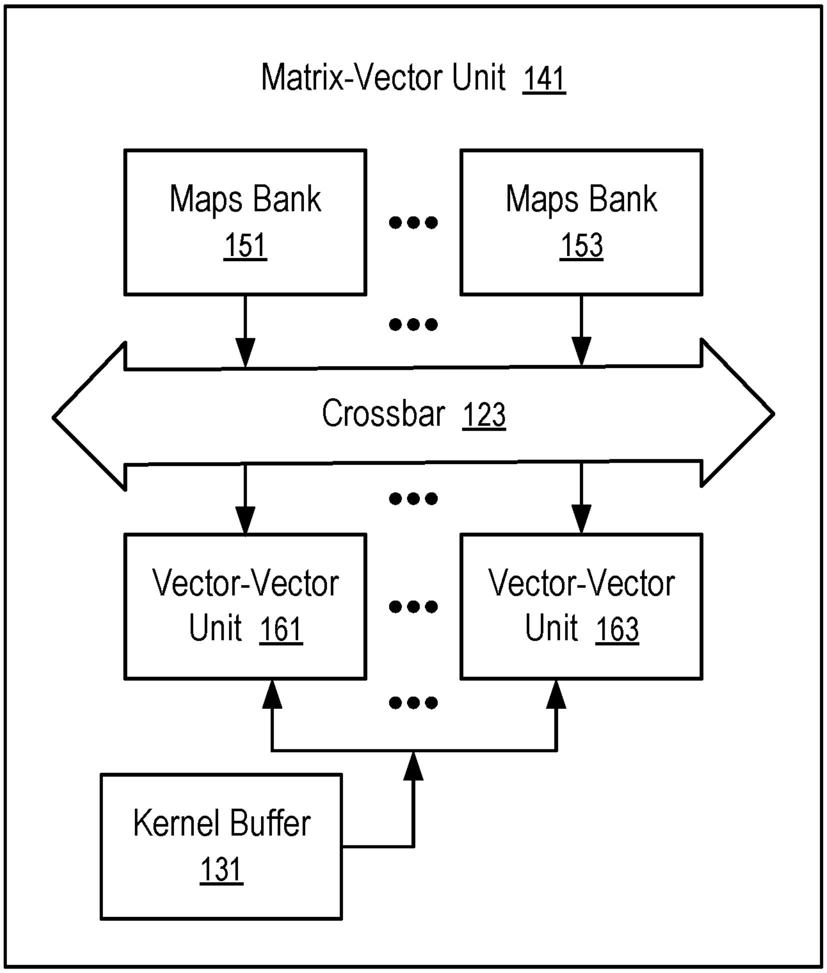
FIG. 3 shows a processing unit configured to perform matrix-vector operations according to one embodiment.

Each of the matrix-vector units (141 to 143) in FIG. 2 can be implemented in a way as illustrated in FIG. 3.

FIG. 3 shows a processing unit configured to perform matrix-vector operations according to one embodiment. For example, the matrix-vector unit (141) of FIG. 3 can be used as any of the matrix-vector units in the matrix-matrix unit (121) of FIG. 2.

In FIG. 3, each of the maps banks (151 to 153) stores one vector of a matrix operand that has multiple vectors stored in the maps banks (151 to 153) respectively, in a way similar to the maps banks (151 to 153) of FIG. 2. The crossbar (123) in FIG. 3 provides the vectors from the maps banks (151) to the vector-vector units (161 to 163) respectively. A same vector stored in the kernel buffer (131) is provided to the vector-vector units (161 to 163).

The vector-vector units (161 to 163) operate concurrently to compute the operation of the corresponding vector operands, stored in the maps banks (151 to 153) respectively, multiplied by the same vector operand that is stored in the kernel buffer (131). For example, the vector-vector unit (161) performs the multiplication operation on the vector operand stored in the maps bank (151) and the vector operand stored in the kernel buffer (131), while the vector-vector unit (163) is concurrently performing the multiplication operation on the vector operand stored in the maps bank (153) and the vector operand stored in the kernel buffer (131).

When the matrix-vector unit (141) of FIG. 3 is implemented in a matrix-matrix unit (121) of FIG. 2, the matrix-vector unit (141) can use the maps banks (151 to 153), the crossbar (123) and the kernel buffer (131) of the matrix-matrix unit (121).

Figure 4:
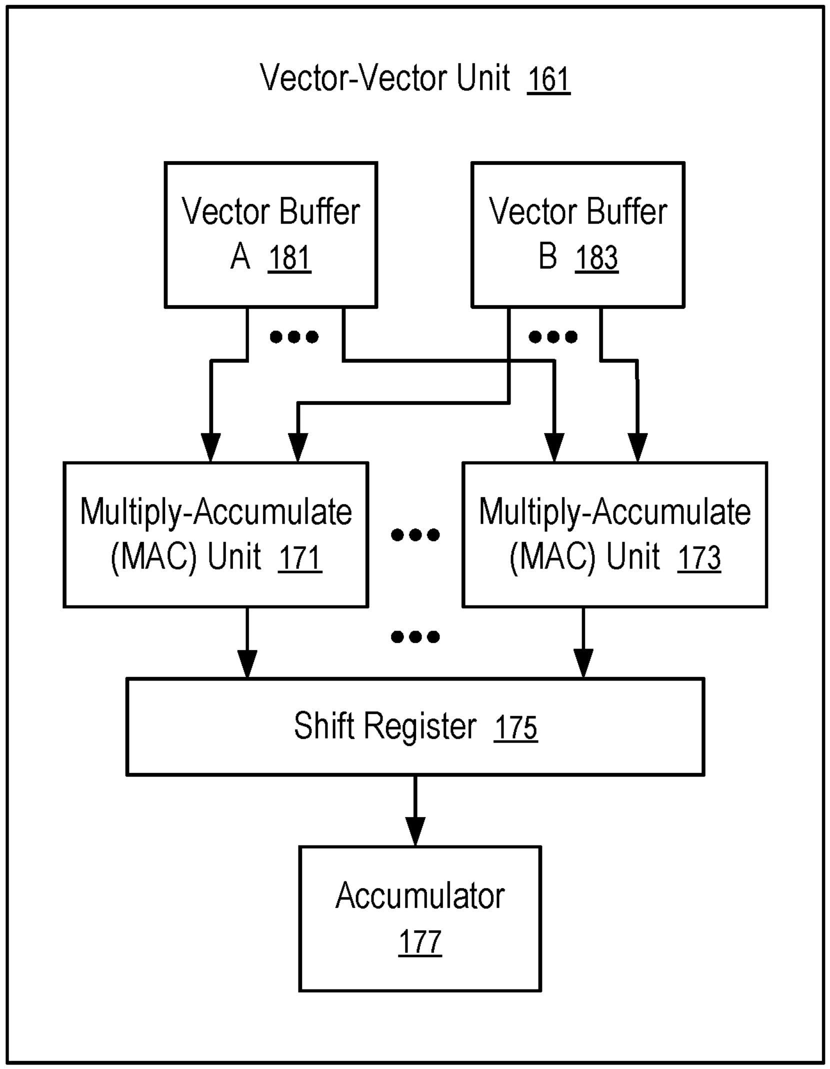
FIG. 4 shows a processing unit configured to perform vector-vector operations according to one embodiment.

Each of the vector-vector units (161 to 163) in FIG. 3 can be implemented in a way as illustrated in FIG. 4.

FIG. 4 shows a processing unit configured to perform vector-vector operations according to one embodiment. For example, the vector-vector unit (161) of FIG. 4 can be used as any of the vector-vector units in the matrix-vector unit (141) of FIG. 3.

In FIG. 4, the vector-vector unit (161) has multiple multiply-accumulate units (171 to 173). Each of the multiply-accumulate units (e.g., 173) can receive two numbers as operands, perform multiplication of the two numbers, and add the result of the multiplication to a sum maintained in the multiply-accumulate unit.

Each of the vector buffers (181 and 183) stores a list of numbers. A pair of numbers, each from one of the vector buffers (181 and 183), can be provided to each of the multiply-accumulate units (171 to 173) as input. The multiply-accumulate units (171 to 173) can receive multiple pairs of numbers from the vector buffers (181 and 183) in parallel and perform the multiply-accumulate (MAC) operations in parallel. The outputs from the multiply-accumulate units (171 to 173) are stored into the shift register (175); and an accumulator (177) computes the sum of the results in the shift register (175).

When the vector-vector unit (161) of FIG. 4 is implemented in a matrix-vector unit (141) of FIG. 3, the vector-vector unit (161) can use a maps bank (e.g., 151 or 153) as one vector buffer (181), and the kernel buffer (131) of the matrix-vector unit (141) as another vector buffer (183).

The vector buffers (181 and 183) can have a same length to store the same number/count of data elements. The length can be equal to, or the multiple of, the count of multiply-accumulate units (171 to 173) in the vector-vector unit (161). When the length of the vector buffers (181 and 183) is the multiple of the count of multiply-accumulate units (171 to 173), a number of pairs of inputs, equal to the count of the multiply-accumulate units (171 to 173), can be provided from the vector buffers (181 and 183) as inputs to the multiply-accumulate units (171 to 173) in each iteration; and the vector buffers (181 and 183) feed their elements into the multiply-accumulate units (171 to 173) through multiple iterations.

In one embodiment, the communication bandwidth of the connection (119) between the Deep Learning Accelerator (103) and the random access memory (105) is sufficient for the matrix-matrix unit (121) to use portions of the random access memory (105) as the maps banks (151 to 153) and the kernel buffers (131 to 133).

In another embodiment, the maps banks (151 to 153) and the kernel buffers (131 to 133) are implemented in a portion of the local memory (115) of the Deep Learning Accelerator (103). The communication bandwidth of the connection (119) between the Deep Learning Accelerator (103) and the random access memory (105) is sufficient to load, into another portion of the local memory (115), matrix operands of the next operation cycle of the matrix-matrix unit (121), while the matrix-matrix unit (121) is performing the computation in the current operation cycle using the maps banks (151 to 153) and the kernel buffers (131 to 133) implemented in a different portion of the local memory (115) of the Deep Learning Accelerator (103).

Figure 5:
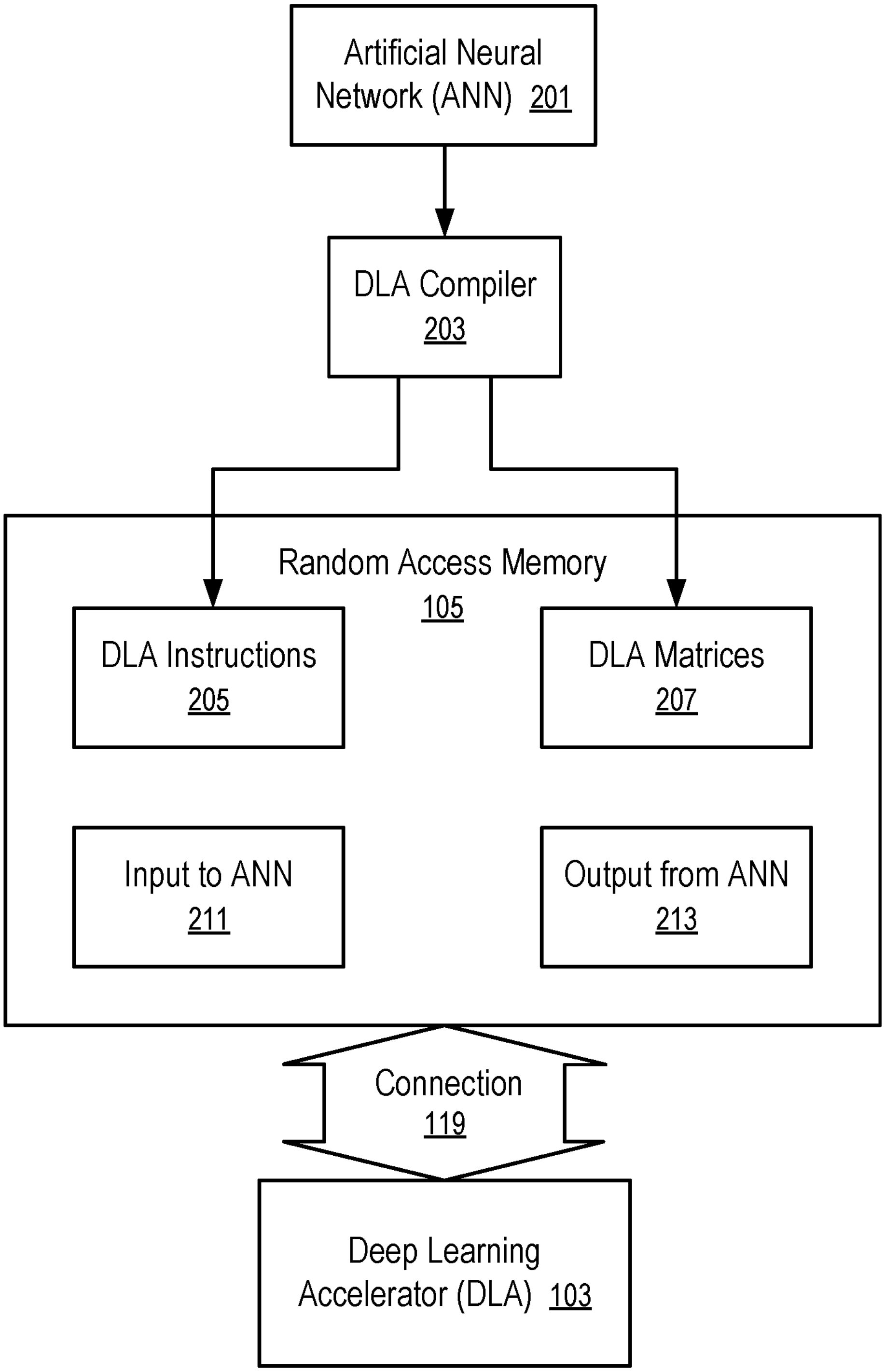
FIG. 5 shows a Deep Learning Accelerator and random access memory configured to autonomously apply inputs to a trained Artificial Neural Network according to one embodiment.

FIG. 5 shows a Deep Learning Accelerator and random access memory configured to autonomously apply inputs to a trained Artificial Neural Network according to one embodiment.

An Artificial Neural Network (201) that has been trained through machine learning (e.g., deep learning) can be described in a standard format (e.g., Open Neural Network Exchange (ONNX)). The description of the trained Artificial Neural Network (201) in the standard format identifies the properties of the artificial neurons and their connectivity.

In FIG. 5, a Deep Learning Accelerator compiler (203) converts trained Artificial Neural Network (201) by generating instructions (205) for a Deep Learning Accelerator (103) and matrices (207) corresponding to the properties of the artificial neurons and their connectivity. The instructions (205) and the matrices (207) generated by the DLA compiler (203) from the trained Artificial Neural Network (201) can be stored in random access memory (105) for the Deep Learning Accelerator (103).

For example, the random access memory (105) and the Deep Learning Accelerator (103) can be connected via a high bandwidth connection (119) in a way as in the integrated circuit device (101) of FIG. 1. The autonomous computation of FIG. 5 based on the instructions (205) and the matrices (207) can be implemented in the integrated circuit device (101) of FIG. 1. Alternatively, the random access memory (105) and the Deep Learning Accelerator (103) can be configured on a printed circuit board with multiple point to point serial buses running in parallel to implement the connection (119).

In FIG. 5, after the results of the DLA compiler (203) are stored in the random access memory (105), the application of the trained Artificial Neural Network (201) to process an input (211) to the trained Artificial Neural Network (201) to generate the corresponding output (213) of the trained Artificial Neural Network (201) can be triggered by the presence of the input (211) in the random access memory (105), or another indication provided in the random access memory (105).

In response, the Deep Learning Accelerator (103) executes the instructions (205) to combine the input (211) and the matrices (207). The matrices (207) can include kernel matrices to be loaded into kernel buffers (131 to 133) and maps matrices to be loaded into maps banks (151 to 153). The execution of the instructions (205) can include the generation of maps matrices for the maps banks (151 to 153) of one or more matrix-matrix units (e.g., 121) of the Deep Learning Accelerator (103).

In some embodiments, the inputs to Artificial Neural Network (201) is in the form of an initial maps matrix. Portions of the initial maps matrix can be retrieved from the random access memory (105) as the matrix operand stored in the maps banks (151 to 153) of a matrix-matrix unit (121). Alternatively, the DLA instructions (205) also include instructions for the Deep Learning Accelerator (103) to generate the initial maps matrix from the input (211).

According to the DLA instructions (205), the Deep Learning Accelerator (103) loads matrix operands into the kernel buffers (131 to 133) and maps banks (151 to 153) of its matrix-matrix unit (121). The matrix-matrix unit (121) performs the matrix computation on the matrix operands. For example, the DLA instructions (205) break down matrix computations of the trained Artificial Neural Network (201) according to the computation granularity of the Deep Learning Accelerator (103) (e.g., the sizes/dimensions of matrices that loaded as matrix operands in the matrix-matrix unit (121)) and applies the input feature maps to the kernel of a layer of artificial neurons to generate output as the input for the next layer of artificial neurons.

Upon completion of the computation of the trained Artificial Neural Network (201) performed according to the instructions (205), the Deep Learning Accelerator (103) stores the output (213) of the Artificial Neural Network (201) at a pre-defined location in the random access memory (105), or at a location specified in an indication provided in the random access memory (105) to trigger the computation.

When the technique of FIG. 5 is implemented in the integrated circuit device (101) of FIG. 1, an external device connected to the memory controller interface (107) can write the input (211) into the random access memory (105) and trigger the autonomous computation of applying the input (211) to the trained Artificial Neural Network (201) by the Deep Learning Accelerator (103). After a period of time, the output (213) is available in the random access memory (105); and the external device can read the output (213) via the memory controller interface (107) of the integrated circuit device (101).

For example, a predefined location in the random access memory (105) can be configured to store an indication to trigger the autonomous execution of the instructions (205) by the Deep Learning Accelerator (103). The indication can optionally include a location of the input (211) within the random access memory (105). Thus, during the autonomous execution of the instructions (205) to process the input (211), the external device can retrieve the output generated during a previous run of the instructions (205), and/or store another set of input for the next run of the instructions (205).

Optionally, a further predefined location in the random access memory (105) can be configured to store an indication of the progress status of the current run of the instructions (205). Further, the indication can include a prediction of the completion time of the current run of the instructions (205) (e.g., estimated based on a prior run of the instructions (205)). Thus, the external device can check the completion status at a suitable time window to retrieve the output (213).

In some embodiments, the random access memory (105) is configured with sufficient capacity to store multiple sets of inputs (e.g., 211) and outputs (e.g., 213). Each set can be configured in a predetermined slot/area in the random access memory (105).

The Deep Learning Accelerator (103) can execute the instructions (205) autonomously to generate the output (213) from the input (211) according to matrices (207) stored in the random access memory (105) without helps from a processor or device that is located outside of the integrated circuit device (101).

In a method according to one embodiment, random access memory (105) of a computing device (e.g., integrated circuit device (101)) can be accessed using an interface (107) of the computing device to a memory controller. The computing device can have processing units (e.g., 111) configured to perform at least computations on matrix operands, such as a matrix operand stored in maps banks (151 to 153) and a matrix operand stored in kernel buffers (131 to 133).

For example, the computing device, implemented using the integrated circuit device (101) and/or other components, can be enclosed within an integrated circuit package; and a set of connections can connect the interface (107) to the memory controller that is located outside of the integrated circuit package.

Instructions (205) executable by the processing units (e.g., 111) can be written into the random access memory (105) through the interface (107).

Matrices (207) of an Artificial Neural Network (201) can be written into the random access memory (105) through the interface (107). The matrices (207) identify the parameters, the property and/or the state of the Artificial Neural Network (201).

Optionally, at least a portion of the random access memory (105) is non-volatile and configured to store the instructions (205) and the matrices (07) of the Artificial Neural Network (201).

First input (211) to the Artificial Neural Network can be written into the random access memory (105) through the interface (107).

An indication is provided in the random access memory (105) to cause the processing units (111) to start execution of the instructions (205). In response to the indication, the processing units (111) execute the instructions to combine the first input (211) with the matrices (207) of the Artificial Neural Network (201) to generate first output (213) from the Artificial Neural Network (201) and store the first output (213) in the random access memory (105).

For example, the indication can be an address of the first input (211) in the random access memory (105); and the indication can be stored a predetermined location in the random access memory (105) to cause the initiation of the execution of the instructions (205) for the input (211) identified by the address. Optionally, the indication can also include an address for storing the output (213).

The first output (213) can be read, through the interface (107), from the random access memory (105).

For example, the computing device (e.g., integrated circuit device (101)) can have a Deep Learning Accelerator (103) formed on a first integrated circuit die and the random access memory (105) formed on one or more second integrated circuit dies. The connection (119) between the first integrated circuit die and the one or more second integrated circuit dies can include Through-Silicon Vias (TSVs) to provide high bandwidth for memory access.

For example, a description of the Artificial Neural Network (201) can be converted using a compiler (203) into the instructions (205) and the matrices (207). The combination of the instructions (205) and the matrices (207) stored in the random access memory (105) and the Deep Learning Accelerator (103) provides an autonomous implementation of the Artificial Neural Network (201) that can automatically convert input (211) to the Artificial Neural Network (201) to its output (213).

For example, during a time period in which the Deep Learning Accelerator (103) executes the instructions (205) to generate the first output (213) from the first input (211) according to the matrices (207) of the Artificial Neural Network (201), the second input to Artificial Neural Network (201) can be written into the random access memory (105) through the interface (107) at an alternative location. After the first output (213) is stored in the random access memory (105), an indication can be provided in the random access memory to cause the Deep Learning Accelerator (103) to again start the execution of the instructions and generate second output from the second input.

During the time period in which the Deep Learning Accelerator (103) executes the instructions (205) to generate the second output from the second input according to the matrices (207) of the Artificial Neural Network (201), the first output (213) can be read from the random access memory (105) through the interface (107); and a further input can be written into the random access memory to replace the first input (211), or written at a different location. The process can be repeated for a sequence of inputs.

The Deep Learning Accelerator (103) can include at least one matrix-matrix unit (121) that can execute an instruction on two matrix operands. The two matrix operands can be a first matrix and a second matrix. Each of two matrices has a plurality of vectors. The matrix-matrix unit (121) can include a plurality of matrix-vector units (141 to 143) configured to operate in parallel. Each of the matrix-vector units (141 to 143) are configured to operate, in parallel with other matrix-vector units, on the first matrix and one vector from second matrix. Further, each of the matrix-vector units (141 to 143) can have a plurality of vector-vector units (161 to 163) configured to operate in parallel. Each of the vector-vector units (161 to 163) is configured to operate, in parallel with other vector-vector units, on a vector from the first matrix and a common vector operand of the corresponding matrix-vector unit. Further, each of the vector-vector units (161 to 163) can have a plurality of multiply-accumulate units (171 to 173) configured to operate in parallel.

The Deep Learning Accelerator (103) can have local memory (115) and a control unit (113) in addition to the processing units (111). The control unit (113) can load instructions (205) and matrix operands (e.g., some of the matrices (207)) from the random access memory (105) for execution by the processing units (111). The local memory can cache matrix operands used by the matrix-matrix unit. The connection (119) can be configured with a bandwidth sufficient to load a set of matrix operands from the random access memory (105) to the local memory (115) during a time period in which the matrix-matrix unit performs operations on two other matrix operands. Further, during the time period, the bandwidth is sufficient to store a result, generated by the matrix-matrix unit (121) in a prior instruction execution, from the local memory (115) to the random access memory (105).

At least some embodiments disclosed herein provide a compiler that can convert a description of an Artificial Neural Network into different sets of instructions executable on multiple sets of hardware of Deep Learning Accelerators. The instructions configure the Deep Learning Accelerators to work together in performing the matrix computation of the Artificial Neural Network.

Optionally, the Deep Learning Accelerators can be implemented using different integrated circuit technologies, such as Field-Programmable Gate Array (FPGA) or Application Specific Integrated circuit (ASIC). Further, Deep Learning Accelerators can have different hardware capabilities in implementing matrix operations.

For example, different hardware implementations of Deep Learning Accelerators can have different numbers of parallel processing units operable to perform matrix operations concurrently.

For example, different hardware implementations of Deep Learning Accelerators can have different matrix computation granularity levels. An instruction can be used to perform a predefined matrix operation on matrix operands. However, the dimensional sizes of the matrix operands of the instruction can vary from one Deep Learning Accelerator to another.

In one embodiment, a compiler is configured to identify multiple portions of an Artificial Neural Network for implementation using multiple Deep Learning Accelerators respectively. For each of the portions of the Artificial Neural Network, the compiler generates a compiler output from the description of the Artificial Neural Network. The compiler output is executable in one of the Deep Learning Accelerators to perform a portion of the computation workload of the Artificial Neural Network. The compiler optimizes the selection of the portions to improve the overall performance of the set of Deep Learning Accelerators in implementing the Artificial Neural Network.

Figure 6:
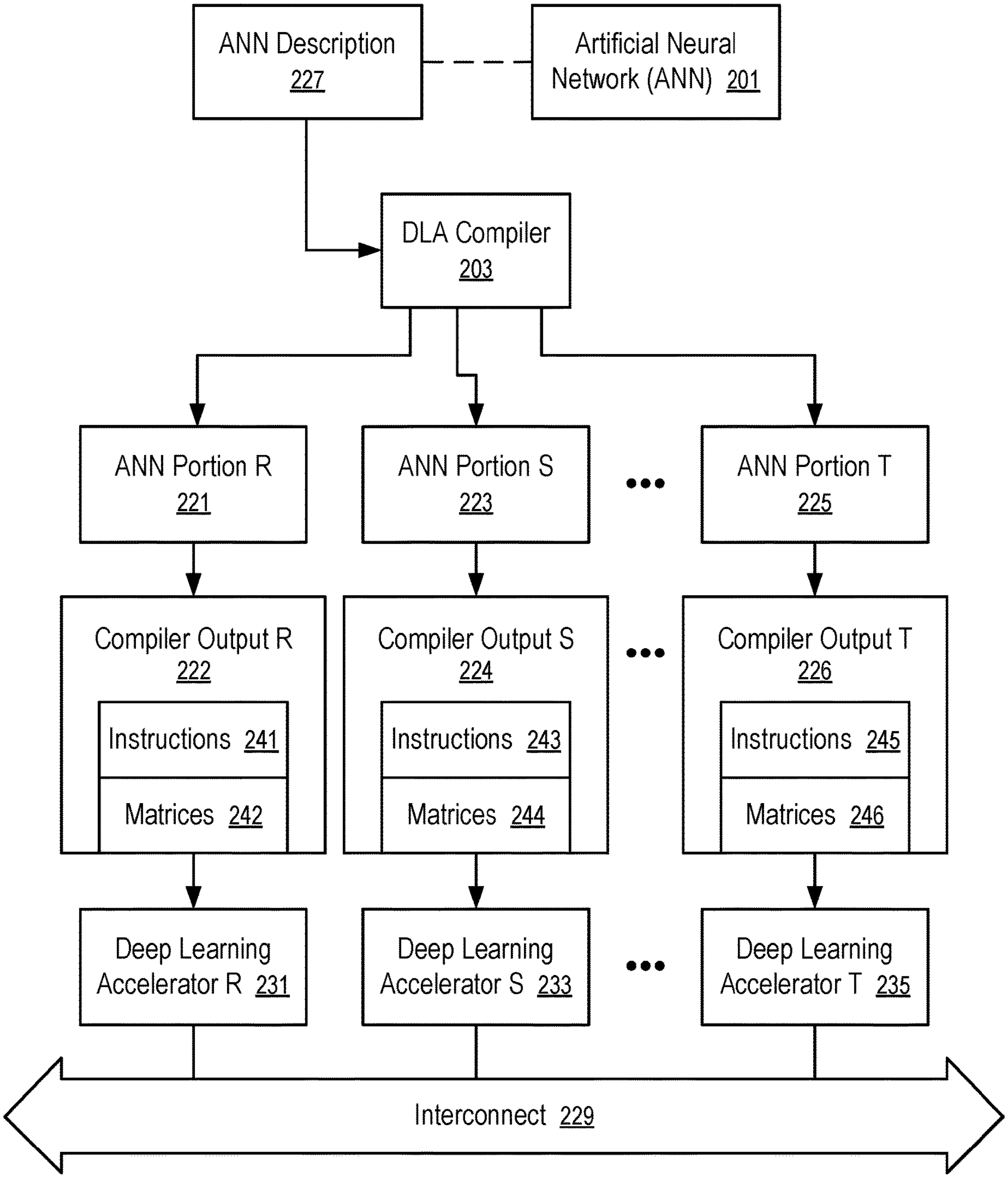
FIG. 6 shows a compiler converting a description of an Artificial Neural Network into compiler outputs for execution on multiple Deep Learning Accelerators according to one embodiment.

FIG. 6 shows a compiler converting a description of an Artificial Neural Network into compiler outputs for execution on multiple Deep Learning Accelerators according to one embodiment.

In FIG. 6, a DLA compiler (203) receives a description (227) of an Artificial Neural Network (201) as an input. The description (227) identifies the parameters of an Artificial Neural Network (201), such as the identifications of the behavior models of artificial neurons in the network and the connectivity of the artificial neurons in the network. For example, the behavior models of the artificial neurons can include the activation functions of the artificial neurons, the biases of the artificial neurons, and/or the states of the artificial neurons. For example, the description (227) can include synaptic weights for connections among the artificial neurons. The description (227) can be provided in a standard format (e.g., Open Neural Network Exchange (ONNX)) to the DLA compiler (203).

The DLA compiler (203) can identify/select multiple portions (e.g., 221, 223, . . . , 225) of the Artificial Neural Network (201) for implementation on multiple Deep Learning Accelerators (e.g., 231, 233, . . . , 235).

For example, the DLA compiler (203) identifies a portion R (221) of the Artificial Neural Network (201) for implementation on a Deep Learning Accelerator R (231). The DLA compiler (203) converts the portion R (221) into a compiler output R (222) that includes matrices (242) representative of parameters of the portion R (221). The compiler output R (222) further includes instructions (241) executable by the Deep Learning Accelerator R (231). In response to an input to the portion R (221) of the Artificial Neural Network (201), the Deep Learning Accelerator R (231) generates an output of the portion R (221) in accordance with the matrices (242) representative of parameters of the portion R (221) of the Artificial Neural Network (201).

Similarly, the DLA compiler (203) identifies a portion S (223) of the Artificial Neural Network (201) for implementation on a Deep Learning Accelerator S (233). The DLA compiler (203) converts the portion S (223) into a compiler output S (224) that includes matrices (244) representative of parameters of the portion S (223). The compiler output S (224) further includes instructions (243) executable by the Deep Learning Accelerator S (233). In response to an input to the portion S (223) of the Artificial Neural Network (201), the Deep Learning Accelerator R (231) generates an output of the portion S (223) in accordance with the matrices (244) representative of parameters of the portion S (223) of the Artificial Neural Network (201).

Similarly, a portion T (225) of the Artificial Neural Network (201) is converted into the compiler output T (226) having the matrices (246) representative of the parameters of the portion T (225) and the instructions (245) executable by a Deep Learning Accelerator T (235) to implement the computation of the portion T (225).

Outputs of the portions (221, 223, . . . , 225) include intermediate results in the Artificial Neural Network (201). An intermediate result of a portion (e.g., 221) can be part of the input to another portion (e.g., 223). The DLA compiler (203) can configure the Deep Learning Accelerators (231, 233, . . . , 235) to obtain and/or to provide the intermediate results as inputs to respective portions.

For example, the Deep Learning Accelerators (231, 233, . . . , 235) are connected to each other via an interconnect (229). The interconnect (229) can include point to point serial connections among integrated circuit devices (e.g., 101) that contain the Deep Learning Accelerators (231, 233, . . . , 235). Alternatively, or in combination, the interconnect (229) can include a bus, or a wired or wireless computer network.

When an intermediate result is available in a Deep Learning Accelerator (e.g., 233), the Deep Learning Accelerator (e.g., 233) can execute a portion of its instructions (e.g., 243) to write the intermediate result to the random access memory (105) of one or more other Deep Learning Accelerators (e.g., 231 or 235) over the interconnect (229) as an input to the one or more other Deep Learning Accelerators (e.g., 231 or 235).

Alternatively, or in combination, when an intermediate result is to be used in a Deep Learning Accelerator (e.g., 231), the Deep Learning Accelerator (e.g., 231) can execute a portion of its instructions (e.g., 241) to read the intermediate result from the random access memory (105) of another Deep Learning Accelerators (e.g., 233 or 235) over the interconnect (229).

Communications among the Deep Learning Accelerators (231, 233, . . . , 235) over the interconnect (229) are generally slower than communications over the high-bandwidth connection (119) between a Deep Learning Accelerator (e.g., 103) and its random access memory (105).

To optimize the performance of the set of Deep Learning Accelerators (231, 233, . . . , 235) in implementing the Artificial Neural Network (201), the DLA compiler (203) can selectively identify the portions (221, 223, . . . , 225) to reduce the amount of data to be communicated over the interconnect (229) among the Deep Learning Accelerators (231, 233, . . . , 235) and to optimize the timing of the communications to reduce delay and conflict.

In some instances, the portions (221, 223, . . . , 225) can have overlapping artificial neurons to reduce the communications over the interconnect (229), to reduce delay, and/or to avoid timing conflict in the use of the interconnect (229).

Figure 7:
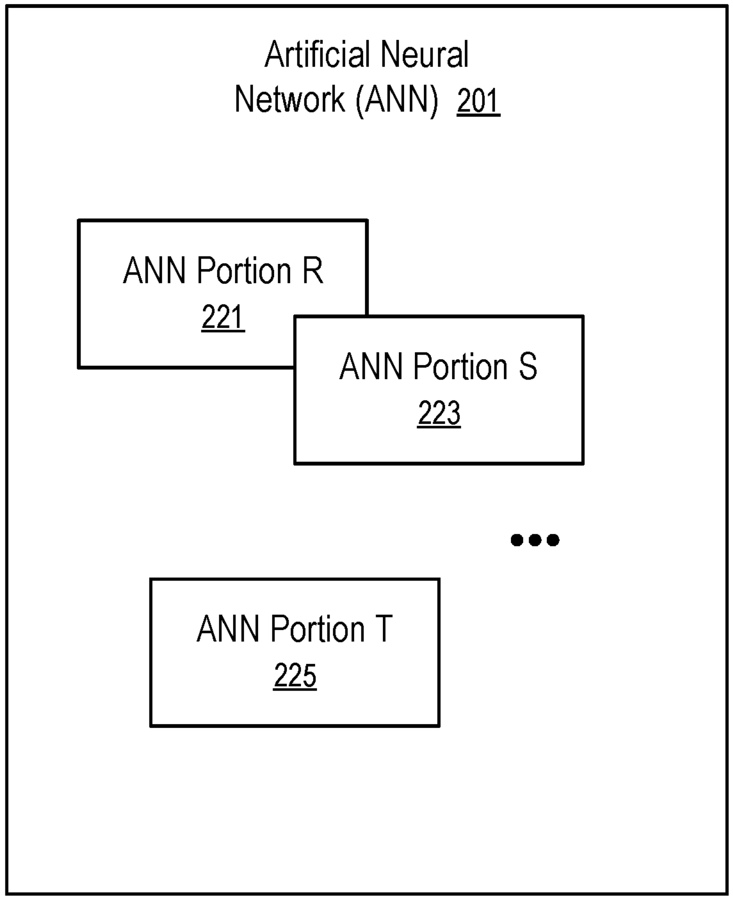
FIG. 7 illustrates multiple portions of an Artificial Neural Network configured to be implemented using multiple Deep Learning Accelerators according to one embodiment.

FIG. 7 illustrates multiple portions of an Artificial Neural Network configured to be implemented using multiple Deep Learning Accelerators according to one embodiment.

In FIG. 7, a portion R (221) of the Artificial Neural Network (201) is configured to be implemented on a Deep Learning Accelerator R (231) illustrated in FIG. 6.

Similarly, a portion S (223) of the Artificial Neural Network (201) is configured to be implemented on another Deep Learning Accelerator S (233) illustrated in FIG. 6

The portions (221 and 223) may have an overlapping region of artificial neurons in the Artificial Neural Network (201). The overlapping region is selected by the DLA compiler (203) to reduce the amount of data communications between the Deep Learning Accelerators (231 and 233), and/or to reduce the delay caused by the communications between the Deep Learning Accelerators (231 and 233).

In general, some of the portions may have overlapping regions, while other portions may not have overlapping regions. The DLA compiler (203) is configured to estimate the computing time of different ways to identify portions for the Deep Learning Accelerators (231 and 233) and adjust the identification of the portions to minimize the time between an input to the Artificial Neural Network (201) to an output from the Artificial Neural Network (201) and/or to minimize the time between the time gap between the set of Deep Learning Accelerators (231 and 233) starting the processing of a current input to the Artificial Neural Network (201) and the time of being available to start the processing of a next input to the Artificial Neural Network (201).

Figure 8:
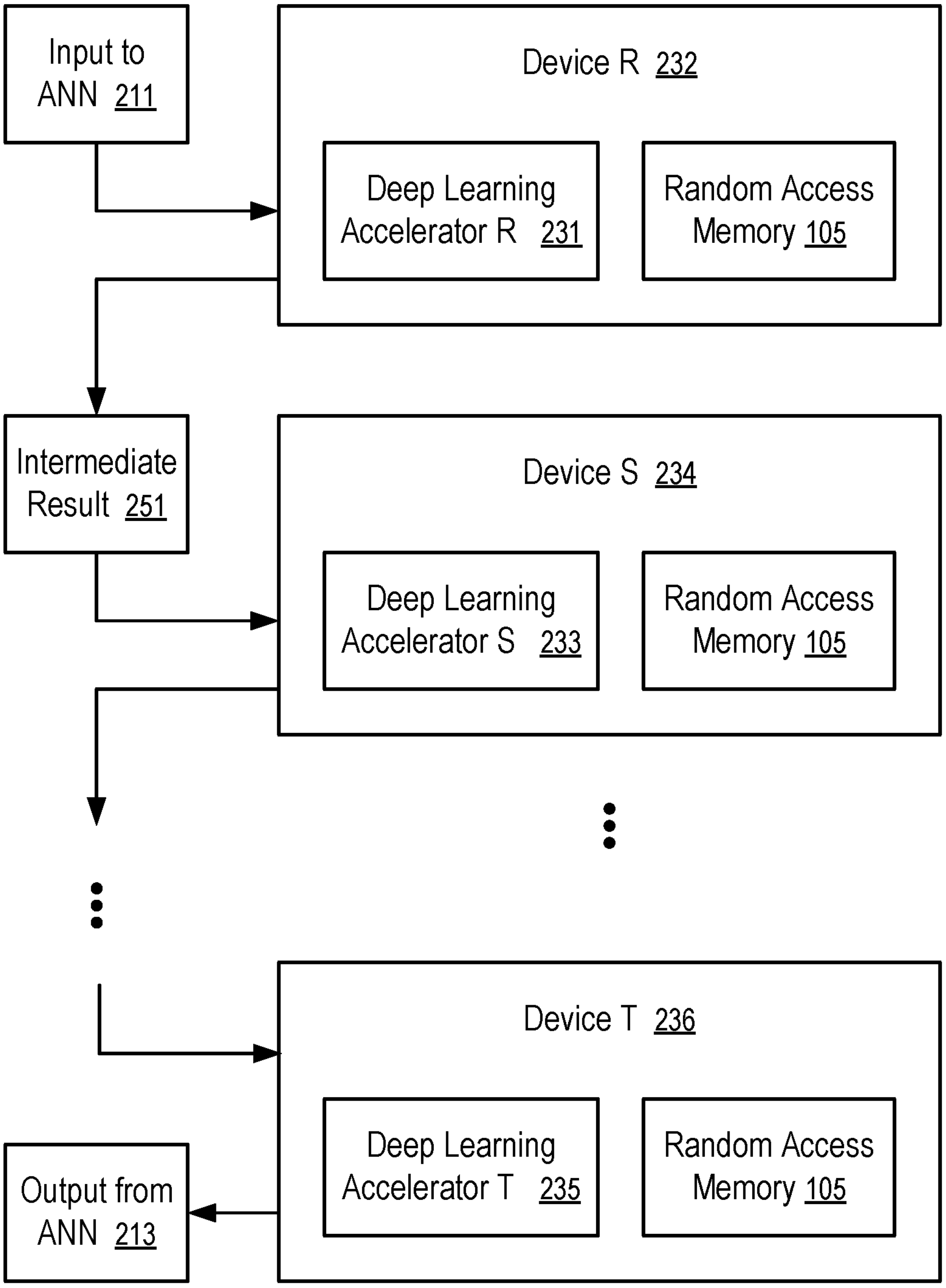
FIGS. 8 and 9 illustrate cooperation among multiple Deep Learning Accelerators to implement an Artificial Neural Network according to some embodiments.
Figure 9:
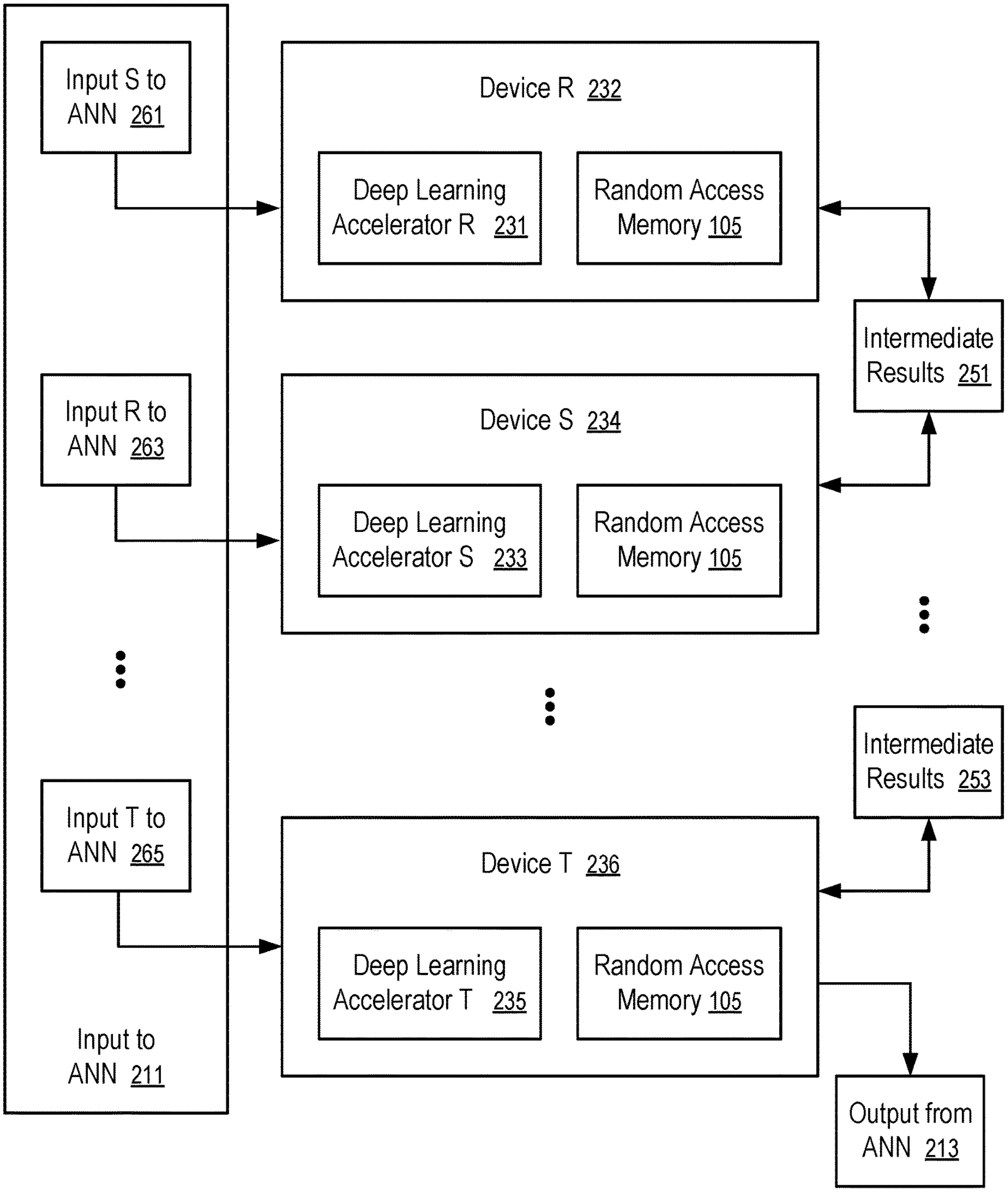

FIGS. 8 and 9 illustrate cooperation among multiple Deep Learning Accelerators to implement an Artificial Neural Network according to some embodiments.

In FIG. 8, multiple devices (232, 234, . . . , 236) have Deep Learning Accelerators (231, 233, . . . , 235). For example, each of the devices (232, 234, . . . , 236) can be implemented using an integrated circuit device (101).

For example, a device R (232) has a Deep Learning Accelerator R (231) that is similar to, or the same as, the Deep Learning Accelerator (103) of FIG. 1. The device R (232) further has random access memory (105) connected to the Deep Learning Accelerator R (231) in a way similar to the random access memory (105) illustrated in FIG. 1.

For example, a device S (234) can be structurally identical to the device R (232). Alternatively, the device S (234) can have hardware features and/or capabilities that are different from those of the device R (232).

For example, the granularity of matrix processing in the Deep Learning Accelerator R (231) of the device R (232) can be different from the granularity of the device S (234).

For example, the random access memory (105) of the device S (234) can have a storage capacity larger (or smaller) than the capacity of the random access memory (105) of the device R (232).

In FIG. 8, the device R (232) is configured to receive the input (211) to the Artificial Neural Network (201); and a device T (236) is configured to provide the output (213) of the Artificial Neural Network (201) responsive to the input (211). The DLA compiler (203) identifies a portion R (221) of the Artificial Neural Network (201) and generates compiler output (222), as illustrated in FIG. 6, for execution in the device R (232). The device R (232) generates an intermediate result (251) of the Artificial Neural Network (201), which corresponding to a response of the portion R (221) of the Artificial Neural Network (201) in response to the input (211).

The DLA compiler (203) identifies a portion S (223) of the Artificial Neural Network (201) and generates compiler output (224), as illustrated in FIG. 6, for execution in the device S (234). The device R (232) receives the intermediate result (251) of the Artificial Neural Network (201) as an input to the portion S (223) and generates a further intermediate result as input to another device.

For example, when the intermediate result (251) is available in the device R (232), the device R (232) can be configured, via the compiler output (222), to write the intermediate result (251) into the random access memory (105) of the device S (234) and cause the device S (234) to execute the compiler output (224) to perform the computation of the portion S (223) responsive to the intermediate result (251).

Alternatively, the device S (234) can be configured via the compiler output (224) to check (e.g., periodically) for the availability of the intermediate result (251) in the random access memory (105) of the device R (232).

For example, when the intermediate result (251) is available in the device R (232), the device R (232) may announce the availability via an interconnect (229) among the devices (e.g., 232, 234, . . . , 235). The announcement can include an identification of the storage location of the intermediate result (251) in the random access memory (105) in the device R (232). Subsequently, the device S (234) can read the random access memory (105) of the device R (232) to retrieve the intermediate result for the execution of the compiler output (224).

For example, the devices (232, 234, . . . , 236) can be chained in a way where a device uses the intermediate result (e.g., 251) generated by a prior device in the chain to provide another intermediate result for the next device in the chain, or the output (213) of the Artificial Neural Network (201).

When the computation of an Artificial Neural Network (201) is implemented in a way illustrated in FIG. 8, the device R (232) is ready to process the next input to the Artificial Neural Network (201) when the intermediate result (251) is generated. The time gap between the current input and the next input that can be processed by the devices (232, 234, . . . , 236) is limited by the longest processing time of the portions (221, 223, . . . , 225) of the Artificial Neural Network (201) in the devices (232, 234, . . . , 236). Using more devices can reduce the time gap and improve the capability of the system in processing inputs of higher frequency.

In FIG. 8, the computations of the portions (221, 223, . . . , 225) of the Artificial Neural Network (201) are performed sequentially. Thus, the latency between the input (211) to the Artificial Neural Network (201) and the output (213) from the Artificial Neural Network (201) is the sum of the processing times in the devices (232, 234, . . . , 236) and the communication times of the intermediate results. Thus, the use of multiple devices (232, 234, . . . , 236) may not improve the latency between the input (211) and the output (213).

FIG. 9 illustrates a configuration where at least parts of the computations of the Artificial Neural Network (201) are performed concurrently in parallel to reduce the latency between the input (211) and the output (213) of the Artificial Neural Network (201).

In FIG. 9, the input (211) to the Artificial Neural Network (201) is divided into inputs (261, 263, . . . , 265) for the portions (221, 223, . . . , 225) of the Artificial Neural Network (201). The devices (232, 234, . . . , 236) can process the inputs (261, 263, . . . , 265) in parallel based on the compiler outputs (222, 224, . . . , 226) generated by the DLA compiler (203).

For example, the input S (261) can be generated by a sensor; and the input R (263) can be generated by another sensor.

For example, the input R (263) can be a portion of an image from a digital camera; and the input T (265) can be another portion of the same image from the camera. Further, the inputs (263 and 265) can include an overlapping region in the image to reduce communications between the devices (234 and 236).

The intermediate results (e.g., 251, . . . , 253) generated by some of the devices can be used in the computations implemented in other devices. The devices (232, 234, . . . , 236) communicates with each other to transmit the intermediate results (e.g., 251, . . . , 253) over the interconnect (229) among the devices (232, 234, . . . , 236). When the latency reduced by the parallel processing is greater than the times used in the communication of the intermediate results (e.g., 253), the latency between the input (211) and the output (213) of the Artificial Neural Network (201) can be reduced via the use of multiple devices (232, 234, . . . , 236).

In general, the DLA compiler (203) can combine the techniques of FIG. 8 and FIG. 9 to customize the performance of the system. The DLA compiler (203) optimizes the identifications of the portions (221, 223, . . . , 225) of the Artificial Neural Network (201) for the devices (232, 234, . . . , 236) to reduce latency between the input (211) and the output (213) of the Artificial Neural Network (201) and/or to increase the frequency of inputs to the Artificial Neural Network (201) that can be processed by the system.

Figure 10:
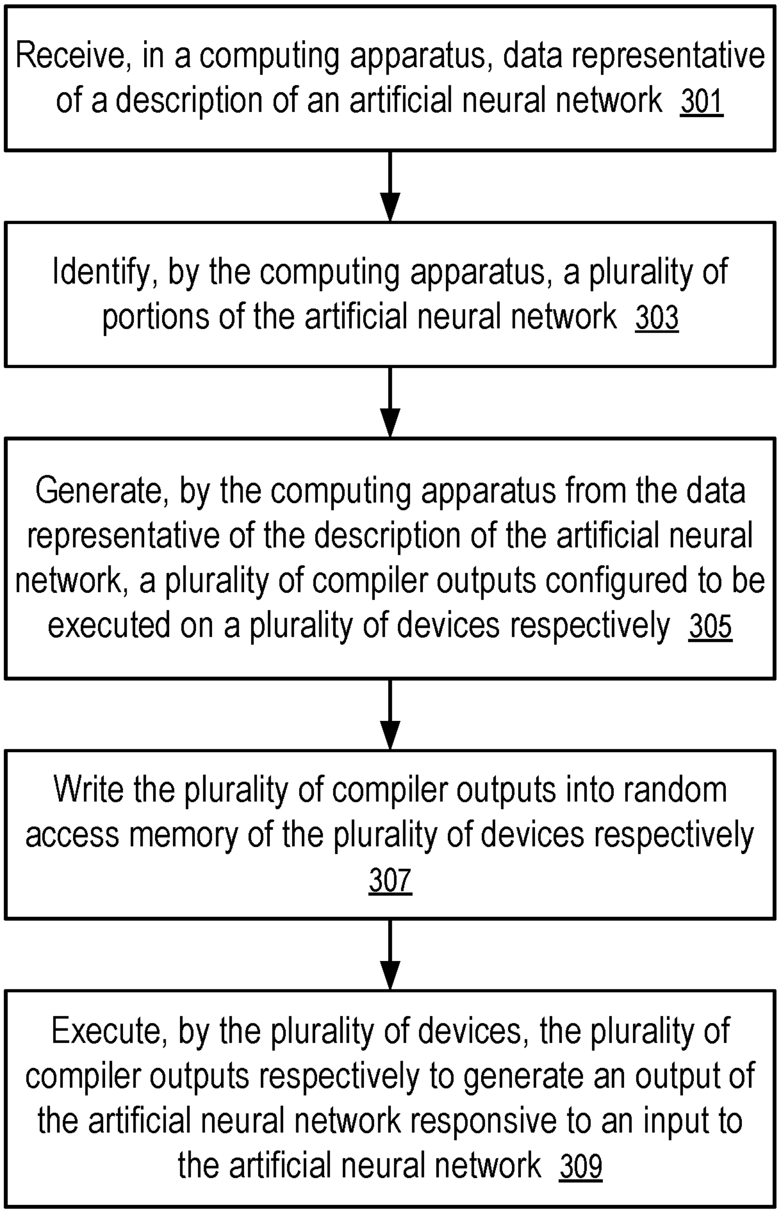
FIG. 10 shows a method of compiling a description of an Artificial Neural Network for implementation using Deep Learning Accelerators according to one embodiment.

FIG. 10 shows a method of compiling a description of an Artificial Neural Network for implementation using Deep Learning Accelerators according to one embodiment. For example, the method of FIG. 10 can be used to generate DLA instructions (205) and DLA matrices (207) for the implementation of the matrix computations of an Artificial Neural Network (201) using a set of connected Deep Learning Accelerators (231, 233, . . . , 235) illustrated in FIG. 6.

At block 301, a computing apparatus receives data representative of a description (227) of an artificial neural network (201).

At block 303, the computing apparatus identifies a plurality of portions (221, 223, . . . , 225) of the artificial neural network (201).

For example, some of the portions (221, 223, . . . , 225) are selected to have an overlapping set of artificial neurons in the artificial neural network (201), as illustrated in FIG. 7.

For example, the DLA compiler (203) can select the plurality of portions of the artificial neural network to reduce latency between an input (211) to the artificial neural network (201) and the output (213) of the artificial neural network (201).

At block 305, the computing apparatus generates, from the data representative of the description (227) of the artificial neural network (201), a plurality of compiler outputs (222, 224, . . . , 226) configured to be executed on a plurality of devices (232, 234, . . . , 236) respectively.

For example, each of the plurality of compiler outputs (222, 224, . . . , 226) includes first data representative of parameters (e.g., matrices 242, 244, . . . , or 246) of a respective portion (e.g., 221, 223, . . . , or 225) of the artificial neural network (201). Further, each of the plurality of compiler outputs (222, 224, . . . , 226) includes second data representative of instructions (e.g., 241, 243, . . . , or 245) executable on a respective device (e.g., 232, 234, . . . , or 236) among the plurality of devices.

As illustrated in FIGS. 8 and 9, each respective device (e.g., 232, 234, . . . , or 236) can have random access memory (105) and at least one processing unit (e.g., 111, 121, 141, and/or 151) configured to perform matrix operations.

As illustrated in FIG. 8, at least a portion of the compiler outputs (222, 224, . . . , 226) are configured to be executed sequentially on multiple of the devices (e.g., 232, 234, . . . , 236) to compute an output (213) of the artificial neural network (201).

As illustrated in FIG. 9, at least a portion of the compiler outputs (222, 224, . . . , 226) are configured to be executed concurrently on multiple of the devices (e.g., 232, 234, . . . , 236) to compute an output (213) of the artificial neural network (201).

At block 307, the plurality of compiler outputs (222, 224, . . . , 226) can be written into random access memory (105) of the plurality of devices (232, 234, . . . , 236) respectively. The compiler outputs (222, 224, . . . , 226) stored in the random access memory (105) of the plurality of devices (232, 234, . . . , 236) configure the plurality of devices (232, 234, . . . , 236) connected via the interconnect (229) to perform matrix computations of the artificial neural network (201).

At block 309, the plurality of devices (232, 234, . . . , 236) execute the plurality of compiler outputs (222, 224, . . . , 226) respectively to generate an output (213) of the artificial neural network (201) responsive to an input (211) to the artificial neural network (201).

For example, a compiler output S (224) stored in the random access memory (105) of a device S (234) is to be executed after the execution of the compiler output R (222) stored in the random access memory (105) of the device R (232) to generate the intermediate result (251) from the input (211) to the Artificial Neural Network (201).

When the intermediate result (251) is available, the device R (232) may write the intermediate result (251) into the random access memory (105) of the device S (234), or announce the availability over the interconnect (229) to allow the device S (234) to read the intermediate result (251) from the random access memory (105) of the device R (232).

For example, as illustrated in FIG. 9, the devices (232, 234, . . . , 236) can execute at least part of the compiler outputs (222, 224, . . . , 226) in parallel to process the inputs (261, 263, . . . , 265) concurrently to reduce the latency between the input (211) to the artificial neural network (201) to the output (213) from the artificial neural network (201).

Figure 11:
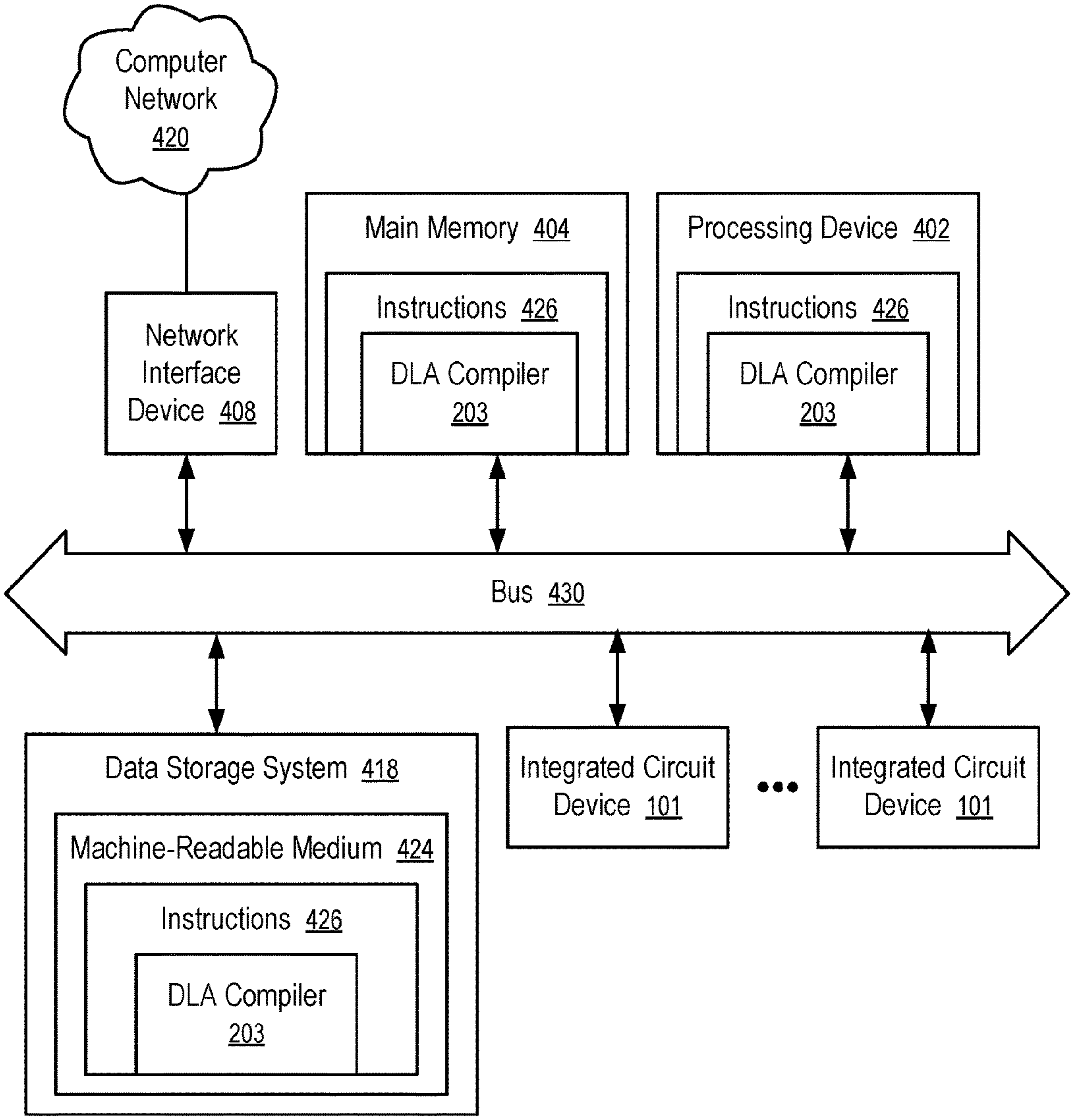
FIG. 11 shows a block diagram of an example computer system in which embodiments of the present disclosure can operate.

For example, the computing apparatus running the compiler (203) can be implemented using a machine illustrated in FIG. 11.

FIG. 11 illustrates an example machine of a computer system within which a set of instructions, for causing the machine to perform any one or more of the methodologies discussed herein, can be executed.

In some embodiments, the computer system of FIG. 11 can implement a system of FIG. 6 with integrated circuit devices (101) having matrix processing units illustrated in FIGS. 2-4. Each of the integrated circuit devices (101) can be used as a device (e.g., 232, 234, . . . , or 236) illustrated in FIG. 1 and/or FIG. 5.

The computer system of FIG. 11 can be used to perform the operations of a DLA Compiler (203) described with reference to FIGS. 1-10 by executing instructions configured to perform the operations corresponding to the DLA Compiler (203).

In some embodiments, the machine can be connected (e.g., networked) to other machines in a Local Area Network (LAN), an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

For example, the machine can be configured as a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system illustrated in FIG. 11 includes a processing device (402), a main memory (404), and a data storage system (418), which communicate with each other via a bus (430). For example, the processing device (402) can include one or more microprocessors; the main memory can include read-only memory (ROM), flash memory, dynamic random access memory (DRAM), such as synchronous DRAM (SDRAM) or Rambus DRAM (RDRAM), static random access memory (SRAM), etc. The bus (430) can include, or be replaced with, multiple buses, multiple point to point serial connections, and/or a computer network.

The processing device (402) in FIG. 11 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device (402) can also be one or more special-purpose processing devices such as an application specific integrated circuit (ASIC), a field programmable gate array (FPGA), a digital signal processor (DSP), a network processor, or the like. The processing device (402) is configured to execute instructions (426) for performing the operations discussed in connection with the DLA compiler (203). Optionally, the processing device (402) can include a Deep Learning Accelerator (103).

The computer system of FIG. 11 can further include a network interface device (408) to communicate over a computer network (420).

Optionally, the bus (430) is connected to one or more integrated circuit devices (101) that each has a Deep Learning Accelerator (103) and Random Access Memory (105) illustrated in FIG. 1. The compiler (203) can write its compiler outputs (e.g., 222, 224, . . . , 226) into the Random Access Memory (105) of the integrated circuit devices (101) to enable the Integrated Circuit Devices (101) to perform matrix computations of portions (221, 223, . . . , 225) of an Artificial Neural Network (201) specified by the ANN description (227). Optionally, the compiler outputs (e.g., 222, 224, . . . , 226) can be stored into the Random Access Memory (105) of one or more other integrated circuit devices (101) through the network interface device (408) and the computer network (420).

The data storage system (418) can include a machine-readable medium (424) (also known as a computer-readable medium) on which is stored one or more sets of instructions (426) or software embodying any one or more of the methodologies or functions described herein. The instructions (426) can also reside, completely or at least partially, within the main memory (404) and/or within the processing device (402) during execution thereof by the computer system, the main memory (404) and the processing device (402) also constituting machine-readable storage media.

In one embodiment, the instructions (426) include instructions to implement functionality corresponding to a DLA Compiler (203), such as the DLA Compiler (203) described with reference to FIGS. 5-10. While the machine-readable medium (424) is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

The present disclosure includes methods and apparatuses which perform the methods described above, including data processing systems which perform these methods, and computer readable media containing instructions which when executed on data processing systems cause the systems to perform these methods.

A typical data processing system may include an interconnect (e.g., bus and system core logic), which interconnects a microprocessor(s) and memory. The microprocessor is typically coupled to cache memory.

The inter-connect interconnects the microprocessor(s) and the memory together and also interconnects them to input/output (I/O) device(s) via I/O controller(s). I/O devices may include a display device and/or peripheral devices, such as mice, keyboards, modems, network interfaces, printers, scanners, video cameras and other devices known in the art. In one embodiment, when the data processing system is a server system, some of the I/O devices, such as printers, scanners, mice, and/or keyboards, are optional.

The inter-connect can include one or more buses connected to one another through various bridges, controllers and/or adapters. In one embodiment the I/O controllers include a USB (Universal Serial Bus) adapter for controlling USB peripherals, and/or an IEEE-1394 bus adapter for controlling IEEE-1394 peripherals.

The memory may include one or more of: ROM (Read Only Memory), volatile RAM (Random Access Memory), and non-volatile memory, such as hard drive, flash memory, etc.

Volatile RAM is typically implemented as dynamic RAM (DRAM) which requires power continually in order to refresh or maintain the data in the memory. Non-volatile memory is typically a magnetic hard drive, a magnetic optical drive, an optical drive (e.g., a DVD RAM), or other type of memory system which maintains data even after power is removed from the system. The non-volatile memory may also be a random access memory.

The non-volatile memory can be a local device coupled directly to the rest of the components in the data processing system. A non-volatile memory that is remote from the system, such as a network storage device coupled to the data processing system through a network interface such as a modem or Ethernet interface, can also be used.

In the present disclosure, some functions and operations are described as being performed by or caused by software code to simplify description. However, such expressions are also used to specify that the functions result from execution of the code/instructions by a processor, such as a microprocessor.

Alternatively, or in combination, the functions and operations as described here can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

While one embodiment can be implemented in fully functioning computers and computer systems, various embodiments are capable of being distributed as a computing product in a variety of forms and are capable of being applied regardless of the particular type of machine or computer-readable media used to actually effect the distribution.

At least some aspects disclosed can be embodied, at least in part, in software. That is, the techniques may be carried out in a computer system or other data processing system in response to its processor, such as a microprocessor, executing sequences of instructions contained in a memory, such as ROM, volatile RAM, non-volatile memory, cache or a remote storage device.

Routines executed to implement the embodiments may be implemented as part of an operating system or a specific application, component, program, object, module or sequence of instructions referred to as "computer programs." The computer programs typically include one or more instructions set at various times in various memory and storage devices in a computer, and that, when read and executed by one or more processors in a computer, cause the computer to perform operations necessary to execute elements involving the various aspects.

A machine readable medium can be used to store software and data which when executed by a data processing system causes the system to perform various methods. The executable software and data may be stored in various places including for example ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a machine readable medium in entirety at a particular instance of time.

Examples of computer-readable media include but are not limited to non-transitory, recordable and non-recordable type media such as volatile and non-volatile memory devices, Read Only Memory (ROM), Random Access Memory (RAM), flash memory devices, floppy and other removable disks, magnetic disk storage media, optical storage media (e.g., Compact Disk Read-Only Memory (CD ROM), Digital Versatile Disks (DVDs), etc.), among others. The computer-readable media may store the instructions.

The instructions may also be embodied in digital and analog communication links for electrical, optical, acoustical or other forms of propagated signals, such as carrier waves, infrared signals, digital signals, etc. However, propagated signals, such as carrier waves, infrared signals, digital signals, etc. are not tangible machine readable medium and are not configured to store instructions.

In general, a machine readable medium includes any mechanism that provides (i.e., stores and/or transmits) information in a form accessible by a machine (e.g., a computer, network device, personal digital assistant, manufacturing tool, any device with a set of one or more processors, etc.).

In various embodiments, hardwired circuitry may be used in combination with software instructions to implement the techniques. Thus, the techniques are neither limited to any specific combination of hardware circuitry and software nor to any particular source for the instructions executed by the data processing system.

The above description and drawings are illustrative and are not to be construed as limiting. Numerous specific details are described to provide a thorough understanding. However, in certain instances, well known or conventional details are not described in order to avoid obscuring the description. References to one or an embodiment in the present disclosure are not necessarily references to the same embodiment; and, such references mean at least one.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A method, comprising:

receiving, in a computing apparatus, data representative of a description of an artificial neural network;

converting, by utilizing a compiler, the description of the artificial neural network into computer instructions and matrices;

identifying, by the computing apparatus, a plurality of portions of the artificial neural network;

generating, by the computing apparatus from the data representative of the description of the artificial neural network and based on the instructions and matrices converted from the description by the compiler, and by utilizing a selected portion of the plurality of portions, a plurality of compiler outputs configured to be executed on a plurality of devices respectively, wherein the plurality of compiler outputs are executable on the plurality of devices to autonomously generate an output of the artificial neural network responsive to an input to the artificial neural network;

writing, into a memory of the computing apparatus, the plurality of compiler outputs; and executing, by utilizing the plurality of devices, a portion of the compiler outputs in parallel to process the input concurrently to adjust a latency between the input to the artificial neural network to the output from the artificial neural network.

2. The method of claim 1, further comprising:

generating, for each of the compiler outputs, first data representative of parameters of a respective portion among the plurality of portions of the artificial neural network and second data representative of instructions executable on the respective device among the plurality of devices.

3. The method of claim 2, further comprising:

executing at least a portion of the compiler outputs sequentially on multiple of the devices.

4. The method of claim 3, further comprising:

executing a first compiler output in the plurality of compiler outputs to generate an intermediate result in the artificial neural network and instruct a first device executing the first compiler output to write the intermediate result into random access memory of a second device executing a second compiler output in the plurality of compiler outputs.

5. The method of claim 3, further comprising:

executing a first compiler output in the plurality of compiler outputs to generate an intermediate result in the artificial neural network and instruct a first device executing the first compiler output to announce availability of the intermediate result to one or more second devices in the plurality of devices.

6. The method of claim 5, further comprising:

executing one or more compiler outputs in the plurality of compiler outputs on the one or more second devices respectively to instruct the one or more second devices to read the intermediate result from random access memory of the first device.

7. The method of claim 2, further comprising:

executing at least the portion of the compiler outputs concurrently on multiple of the devices in generating the output of the artificial neural network.

8. The method of claim 7, further comprising:

selecting the plurality of portions of the artificial neural network to adjust the latency between the input to the artificial neural network and the output of the artificial neural network.

9. The method of claim 7, further comprising:

selecting a first portion among the plurality of portions of the artificial neural network and a second portion among the plurality of portions to have an overlapping set of artificial neurons in the artificial neural network in adjusting the latency between the input to the artificial neural network and the output of the artificial neural network.

10. The method of claim 2, further comprising:

writing the plurality of compiler outputs into the plurality of devices respectively to configure the plurality of devices to perform matrix computations of the artificial neural network.

11. A computing apparatus, comprising:

memory; and at least one microprocessor configured to:

receive data representative of a description of an artificial neural network;

converting, by utilizing a compiler, the description of the artificial neural network into computer instructions and matrices;

identify a plurality of portions of the artificial neural network;

generate, from the data representative of the description of the artificial neural network and based on the instructions and matrices converted from the description by the compiler, a plurality of compiler outputs configured to be executed on a plurality of devices respectively and by utilizing a selected portion of the plurality of portions, wherein the plurality of compiler outputs are executable on the plurality of devices to autonomously generate an output of the artificial neural network responsive to an input to the artificial neural network;

write, into the memory, the plurality of compiler outputs; and execute a portion of the compiler outputs in parallel to process the input concurrently to adjust a latency between the input to the artificial neural network to the output from the artificial neural network.

12. The computing apparatus of claim 11, wherein each respective device in the plurality of devices has random access memory and at least one processing unit configured to perform matrix operations; and each of the plurality of compiler outputs includes first data representative of parameters of a respective portion among the plurality of portions of the artificial neural network and second data representative of instructions executable on a respective device among the plurality of devices.

13. The computing apparatus of claim 12, further comprising the plurality of devices; and the at least one microprocessor is configured to write the plurality of compiler outputs into the plurality of devices respectively to configure the plurality of devices to perform matrix computations of the artificial neural network.

14. The computing apparatus of claim 13, wherein at least a portion of the compiler outputs are configured to be executed sequentially on multiple of the devices.

15. The computing apparatus of claim 13, wherein at least a portion of the compiler outputs are configured to be executed concurrently on multiple of the devices in generating the output of the artificial neural network.

16. The computing apparatus of claim 13, wherein the each respective device in the plurality of devices comprises an integrated circuit die of a Field-Programmable Gate Array (FPGA) or Application Specific Integrated Circuit (ASIC) implementing a Deep Learning Accelerator, the Deep Learning Accelerator configured to load instructions from the random access memory for execution.

17. The computing apparatus of claim 16, wherein the at least one processing unit is configured to operate on two matrix operands of an instruction.

18. A non-transitory computer-readable medium storing instructions which when executed by a computing apparatus cause the computing apparatus to perform a method, the method comprising:

receiving, in the computing apparatus, data representative of a description of an artificial neural network;

converting, by utilizing a compiler, the description of the artificial neural network into computer instructions and matrices;

identifying, by the computing apparatus, a plurality of portions of the artificial neural network;

generating, by the computing apparatus from the data representative of the description of the artificial neural network and based on the instructions and matrices converted from the description by the compiler, and by utilizing a selected portion of the plurality of portions, a plurality of compiler outputs configured to be executed on a plurality of devices respectively, wherein the plurality of compiler outputs are executable on the plurality of devices to autonomously generate an output of the artificial neural network responsive to an input to the artificial neural network;

writing, into a memory of the computing apparatus, the plurality of compiler outputs; and executing, by utilizing the plurality of devices, a portion of the compiler outputs in parallel to process the input concurrently to adjust a latency between the input to the artificial neural network to the output from the artificial neural network.

19. The non-transitory computer-readable medium of claim 18, wherein the method further comprises:

selecting the plurality of portions of the artificial neural network to adjust the latency between the input to the artificial neural network and the output of the artificial neural network.

20. The non-transitory computer-readable medium of claim 19, wherein a first portion among the plurality of portions and a second portion among the plurality of portions are selected to have an overlapping set of artificial neurons in the artificial neural network.

* * * * *